(12) United States Patent
Haba

(10) Patent No.: US 6,822,320 B2
(45) Date of Patent: Nov. 23, 2004

(54) MICROELECTRONIC CONNECTION COMPONENTS UTILIZING CONDUCTIVE CORES AND POLYMERIC COATINGS

(75) Inventor: Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/254,926

(22) Filed: Sep. 25, 2002

(65) Prior Publication Data

US 2003/0025192 A1 Feb. 6, 2003

Related U.S. Application Data

(62) Division of application No. 09/119,079, filed on Jul. 10, 1998, now Pat. No. 6,492,201.

(51) Int. Cl.[7] .............................................. H01L 23/02
(52) U.S. Cl. ........................ 257/686; 257/698; 257/729; 257/774; 257/786
(58) Field of Search .................... 438/121, 122, 438/124, 127, 666, 667, 758; 257/680, 686, 690, 698, 701, 703, 729, 730, 738, 773, 774, 778, 779, 780, 784, 786, 692, 693; 361/760, 767, 771, 772, 776

(56) References Cited

U.S. PATENT DOCUMENTS

| 2,745,898 A | 5/1956 | Hurd |
| 3,576,939 A | 5/1971 | Ziemek |
| 3,628,106 A | 12/1971 | Frank et al. |
| 3,892,646 A | 7/1975 | Lazzarini et al. |
| 3,908,187 A | 9/1975 | Sheldon et al. |
| 3,911,475 A | 10/1975 | Szedon et al. |
| 4,303,715 A | 12/1981 | Chang |
| 4,321,290 A | 3/1982 | Thams |
| 4,394,712 A | 7/1983 | Anthony |
| 4,601,916 A | 7/1986 | Arachtingi |
| 4,714,646 A | 12/1987 | Fletcher et al. |
| 4,743,710 A | 5/1988 | Shieber et al. |
| 4,760,105 A | 7/1988 | Fuller et al. |
| 4,844,784 A | 7/1989 | Suzuki et al. |
| 4,997,698 A | 3/1991 | Oboodi et al. |
| 5,148,265 A | 9/1992 | Khandros et al. |
| 5,148,266 A | * 9/1992 | Khandros et al. ........... 257/773 |

(List continued on next page.)

FOREIGN PATENT DOCUMENTS

| JP | 01155633 A | * 6/1989 | ........... H01L/21/60 |
| JP | 1-225197 | 9/1989 | |
| WO | WO 96/02959 | 2/1996 | |
| WO | WO 97/405958 | 11/1997 | |

OTHER PUBLICATIONS

Material Safety Data Sheet Coatings and Resins Group, PPG Industries, Inc, Product Code: CP932, Revised Sep. 3, 1997, Prepared Nov. 7, 1997 Product Trade Name: Powercron Paste; Chemical Family: Pigment Dispersion.

(List continued on next page.)

*Primary Examiner*—Alonzo Chambliss
(74) *Attorney, Agent, or Firm*—Lerner, David, Littenberg, Krumholz & Mentlik, LLP

(57) ABSTRACT

An electrically conductive article such as a sheet having holes therein is coated with a dielectric polymer using a multi-stage electrophoretic deposition process. A coating of uncured polymer is deposited electrophoretically and then cured. After the first polymer is cured, the part is subject to a further electrophoretic deposition process and further curing. Use of a second electrophoretic deposition step allows effective coating of parts having small holes without plugging the holes. The coated parts may be used as microelectronic connection components such as chip carriers used in packaging semiconductor chips.

13 Claims, 6 Drawing Sheets

U.S. PATENT DOCUMENTS

| | | |
|---|---|---|
| 5,153,986 A | 10/1992 | Brauer et al. |
| 5,224,265 A | 7/1993 | Dux et al. |
| 5,232,548 A | 8/1993 | Ehrenberg et al. |
| 5,288,377 A | 2/1994 | Johnson et al. |
| 5,397,917 A | 3/1995 | Ommen et al. |
| 5,489,749 A | 2/1996 | DiStefano et al. |
| 5,491,302 A | 2/1996 | Distefano et al. |
| 5,518,964 A | 5/1996 | DiStefano et al. |
| 5,558,928 A | 9/1996 | DiStefano et al. |
| 5,570,504 A * | 11/1996 | DiStefano et al. ............ 29/830 |
| 5,590,460 A | 1/1997 | DiStefano et al. |
| 5,597,470 A | 1/1997 | Karavakis et al. |
| 5,629,239 A | 5/1997 | DiStefano et al. |
| 5,632,631 A | 5/1997 | Fjelstad et al. |
| 5,659,952 A | 8/1997 | Kovac et al. |
| 5,679,977 A * | 10/1997 | Khandros et al. ........... 257/692 |
| 5,738,928 A | 4/1998 | Kodani et al. |
| 5,763,941 A * | 6/1998 | Fjelstad ...................... 257/669 |
| 5,786,986 A | 7/1998 | Bregman et al. |
| 5,866,942 A | 2/1999 | Suzuki et al. |
| 5,900,675 A * | 5/1999 | Appelt et al. ................ 257/778 |
| 5,915,170 A * | 6/1999 | Raab et al. .................. 438/118 |
| 6,130,116 A * | 10/2000 | Smith et al. ................. 438/127 |
| 6,208,025 B1 * | 3/2001 | Bellaar et al. .............. 257/696 |
| 6,329,607 B1 * | 12/2001 | Fjelstad et al. ............. 174/261 |
| 6,338,340 B1 * | 1/2002 | Finch et al. ........... 128/205.27 |
| 6,518,662 B1 * | 2/2003 | Smith et al. ................. 257/724 |
| 6,572,781 B2 * | 6/2003 | Haba ........................... 216/33 |
| 6,664,621 B2 * | 12/2003 | Smith et al. ................. 257/692 |

OTHER PUBLICATIONS

Material Safety Data Sheet Coatings and Resins Group, PPG Industries, Inc, Product Code: EIV643, Revised Sep. 15, 1997, Prepared Sep. 16, 1997 Product Trade Name: Powercon Resin; Chemical Family; Epoxy.

* cited by examiner

MICROELECTRONIC CONNECTION COMPONENTS UTILIZING CONDUCTIVE CORES AND POLYMERIC COATINGS

CROSS-REFERENCE TO RELATED APPLICATIONS

The present application is a divisional of U.S. patent application Ser. No. 09/119,079, filed Jul. 10, 1998, now U.S. Pat. No. 6,492,201, the disclosure of which is incorporated by reference herein.

BACKGROUND OF THE INVENTION

The present invention relates to fabrication of circuit components for use in microelectronics by electrophoretic deposition.

Microelectronic assemblies and sub-assemblies such as packaged semiconductor chips, multi-chip modules, and larger circuits utilize many components which include dielectric layers and conductive, typically metallic components on such dielectric layers. For example, as disclosed in commonly assigned U.S. Pat. Nos. 5,148,265; 5,489,749; and 5,518,964, the disclosures of which are hereby incorporated by reference herein, a chip package may include a generally flat, sheet-like dielectric element having metallic conductive features such as terminals, and in some cases, electrically conductive traces extending along a surface of the sheet. These traces may be formed integrally with flexible leads which serve to connect the terminals to contacts on a semiconductor chip. Typically, the sheet-like dielectric element is flexible and is positioned adjacent to the chip. For example, the sheet-like element may overly a surface over the chip and a compliant layer may be provided between the dielectric element and the chip. These elements are sometimes referred to as a "chip carriers" or "interposers."

Other structures used in microelectronics include single layer and multi-layer circuit panels such as those described, for example, in commonly assigned U.S. Pat. Nos. 5,570,504 and 5,558,928, the disclosures of which are hereby incorporated by reference herein. These circuit panels include one or more layers of a dielectric material with conductive traces extending along the dielectric material. Still other components used in microelectronics include sockets such as those described in commonly assigned U.S. Pat. No. 5,632,631 and commonly assigned PCT International publication WO97/44859, the disclosures of which are also incorporated by reference herein. Conductive features on microelectronic components such as packaged semiconductor chips may be engaged with these sockets to make a temporary or permanent electrical connection.

These aforesaid components most commonly are fabricated by techniques similar to those used to manufacture flexible printed circuits. Such techniques use pre-formed sheets of flexible dielectric materials, most commonly Polyimide and form metallic features on these sheets. For example, metallic features can be formed by selectively depositing metals such as copper on the dielectric sheets, or by laminating the dielectric sheets with sheets of metal and etching the metallic sheets to form the required metallic features. The metallic features in some instances include metallic features extending vertically through a sheet, between its major surfaces, commonly referred to as "vias." Vias typically are formed by depositing metal into holes extending through the dielectric layer as, for example, by processes such as sputtering, electroless plating and electroplating. As described in some of the foregoing documents, microelectronic connection components such as chip carriers, circuit panels and sockets may incorporate electrically conductive potential plane elements, typically the form of thin, sheet-like metallic layers overlying a dielectric layer or sandwiched between dielectric layers. These potential plane elements typically are connected to a source of a constant potential such as power or ground potential.

As described, for example, in U.S. Pat. No. 5,590,460, the disclosure of which is incorporated by reference herein, layers for use within multi-layer circuit panels have been fabricated by providing a metallic sheet with holes extending through the sheet and depositing a polymeric material such as an epoxy or an acrylic polymer using an electrophoretic deposition process. In the electrophoretic deposition process, the sheet is immersed in a bath containing uncured polymer. An electrical potential is maintained between the sheet and a counterelectrode in contact with the bath. The electrical field causes the uncured polymer to deposit as a thin coating on the sheet. After coating, the sheet is removed from the bath and the still adhering droplets of the bath are removed, as by rinsing the sheet. The uncured polymer is then cured, typically by baking the sheet at an elevated temperature. The resulting continuous dielectric coating covers the major surfaces of the sheet and extends through the holes as well, so as to form hollow dielectric liners extending within the holes of the sheet. As also described in the '460 patent, metallic structures can be formed within the holes of such a layer and can be used to connect adjoining layers of the multi-layer circuit with one another.

Arachtingi, U.S. Pat. No. 4,601,916 discloses a multi-step process in which insulation is provided on opposed surfaces of a metallic sheet; holes are formed in the composite assembly thereby exposing some of the metal within the holes and the metal is then etched back thereby enlarging the holes. Following this etching step, a coating is applied onto the exposed metal surfaces within the holes by an electrophoretic deposition process. Fletcher et al., U.S. Pat. No. 4,714,646 and Japanese Patent Publication JP 01-225197 describe electrophoretic deposition processes forming circuit panel elements. Another process, taught in U.S. Pat. No. 4,783,247 utilizes electrophoretic coating after electrostatic spray coating of metallic cores having holes therein. Still other processes involving electrophoretic deposition of insulators on metal cores of circuit panels are disclosed in Thams, U.S. Pat. No. 4,321,290. Kodani et al., U.S. Pat. No. 5,738,928 discloses a tape automated bonding ("TAB") tape using a metal core coated with an insulating adhesive material.

Despite considerable interest in the art in using electrophoretic deposition of an insulating layer on a metal conducting layer to make metal core layers, these processes have not been adopted in fabrication of chip carriers heretofore. Certain chip carriers require very fine vias, having diameters below about 100 $\mu$m (0.004 inches) and in some cases 75 $\mu$m (0.003 inches) or less. Processing problems arise when attempts are made to use conventional electrophoretic deposition processes to provide polymeric linings in such small holes in conjunction with continuous polymeric coatings on the surfaces of a metal or other conductive layer. In some instances, the cured polymeric material does not form a continuous polymeric coating over all of the interior surfaces of the holes. Attempts to correct this problem by increasing the time of exposure to the polymeric coating bath or by increasing the electrical potential applied during the coating process can provide a heavier polymeric coating. However, the polymeric coatings typically still suffer from defects within the interior of the holes. If the coating weight is increased to a point where the defects disappear, the coating typically plugs the holes, making it impossible to form conductive structures within the holes.

SUMMARY OF THE INVENTION

One aspect of the present invention provides an improved process for making microelectronic components. The process according to this aspect of the invention includes the step of providing an electrically conductive, typically metallic element such as a sheet or a lead frame having oppositely facing first and second major surfaces and having holes extending through the sheet. A first coating of uncured polymer is deposited by electrophoretic deposition, preferably by immersing the conductive sheet in a liquid bath containing an uncured polymer, contacting the bath with a counterelectrode and applying an electrical potential between the counterelectrode and the conductive sheet to coat the sheet with uncured polymer. After this deposition step, the sheet is removed from the bath and preferably freed from excess polymer by rinsing or otherwise removing loosely adhering polymer and bath solution. The uncured polymer on the sheet is then cured to form a first dielectric coating, typically by heating. After the first dielectric coating is deposited, the electrophoretic deposition process is repeated using a different polymer bath or, preferably, a bath containing the same polymer as used in the first electrophoretic deposition process. The sheet is once again removed from the bath and loosely adhering solution is removed, whereupon the sheet is subjected to a second curing process to cure the coating applied in the second electrophoretic deposition step. The resulting coated sheet has a cured polymeric layer overlying the conductive sheet and forming a continuous dielectric liner within the holes. The process can provide reliable, continuous dielectric liners within holes smaller than 100 $\mu$m in diameter and in some cases, smaller than 75 $\mu$m without plugging the holes with the dielectric material, and can also form reliable coatings within larger holes. Although the present invention is not limited by any theory of operation, it is believed that the dielectric film formed by the first curing step provides good coverage of the major surfaces of the element, so that any uncovered areas are concentrated in the interiors of the holes. Thus, the second electrophoretic deposition step is believed to deposit the uncured polymer selectively at any exposed conductive areas of the sheet, within the holes. Moreover, the cured polymer deposited in the first stage encircles the holes at the major surfaces during the second curing step. The uncured polymer at the interior surfaces of the holes may become liquid or partially liquid during the second curing step. The cured polymer encircling the holes may assure that surface tension or shrinkage of the polymer does not cause retraction of the polymer layer from the interior surfaces of the holes during the second curing step. Regardless of the mechanism of operation, it has been found that procedures according to this aspect of the present invention can provide reliable dielectric coverings of the metallic element, including the interiors of the holes, under conditions which do not result in the filling of the holes by the dielectric material, even where the holes are very small.

Most preferably, the conductive element is a metallic sheet or other metallic part between about 10 $\mu$m and 100 $\mu$m thick. The holes may be formed in the metallic element by conventional processes such as selective electrochemical etching or mechanical punching. After the holes are formed, the metallic element desirably is subjected to an electropolishing process. In the electropolishing process, the metallic element is immersed in a liquid electrolyte and the metallic element is maintained at a positive electrical potential with respect to a cathode also immersed in the electrolyte, so that metal is removed from the element by electrolytic action. The electropolishing process forms smooth surfaces within the holes and the major surfaces. This facilitates reliable formation of dielectric layers.

Another aspect of the present invention includes a microelectronic structure including an electrically conductive metallic core having a pair of oppositely facing major surfaces and having holes extending therethrough smaller than 100 $\mu$m and desirably smaller than 75 $\mu$m in diameter. The component further includes a polymeric dielectric layer overlying and adhering to the metallic core and extending into the holes, the coating being such that it does not completely fill the holes. Most preferably, metallic conductive elements extend through the holes and are isolated from the core by the polymeric dielectric layer within the holes.

Yet another aspect of the present invention provides a chip carrier for use in making a packaged semiconductor chip. A chip carrier in accordance with this aspect of the present invention includes a structure having a sheet-like metallic core, a polymeric dielectric coating overlying and adhering to the metallic core and terminals disposed on the coating so that the coating maintains at least some of the terminals electrical isolated from the core. The chip carrier also includes flexible leads connected to the terminals and extending from the structure for bonding to contacts of a semiconductor chip. The structure may have one or more bond windows. In this case, the metallic core desirably has apertures at each such bond window and the coating extends into the apertures of the core and covers the metallic core within the bond windows. The flexible leads desirably extend at least partially across the bond windows so that the regions of the leads within the bond windows may be bonded to contacts on the chip. One or more of the flexible leads may be electrically connected to the core to serve as a ground or power leads to the chip. Chip carriers according to this aspect of the invention may also include small vias extending through holes in the core, these vias being insulated from the core by portions of the polymeric dielectric coating extending into the holes. Still further aspects of the invention include microelectronic assemblies including chip carriers as aforesaid.

These and other features and advantages of the present invention will be more readily apparent from the detailed description of the preferred embodiments set forth below, taken into conjunction with the accompanying drawings.

DETAILED DESCRIPTION

Figure 1:
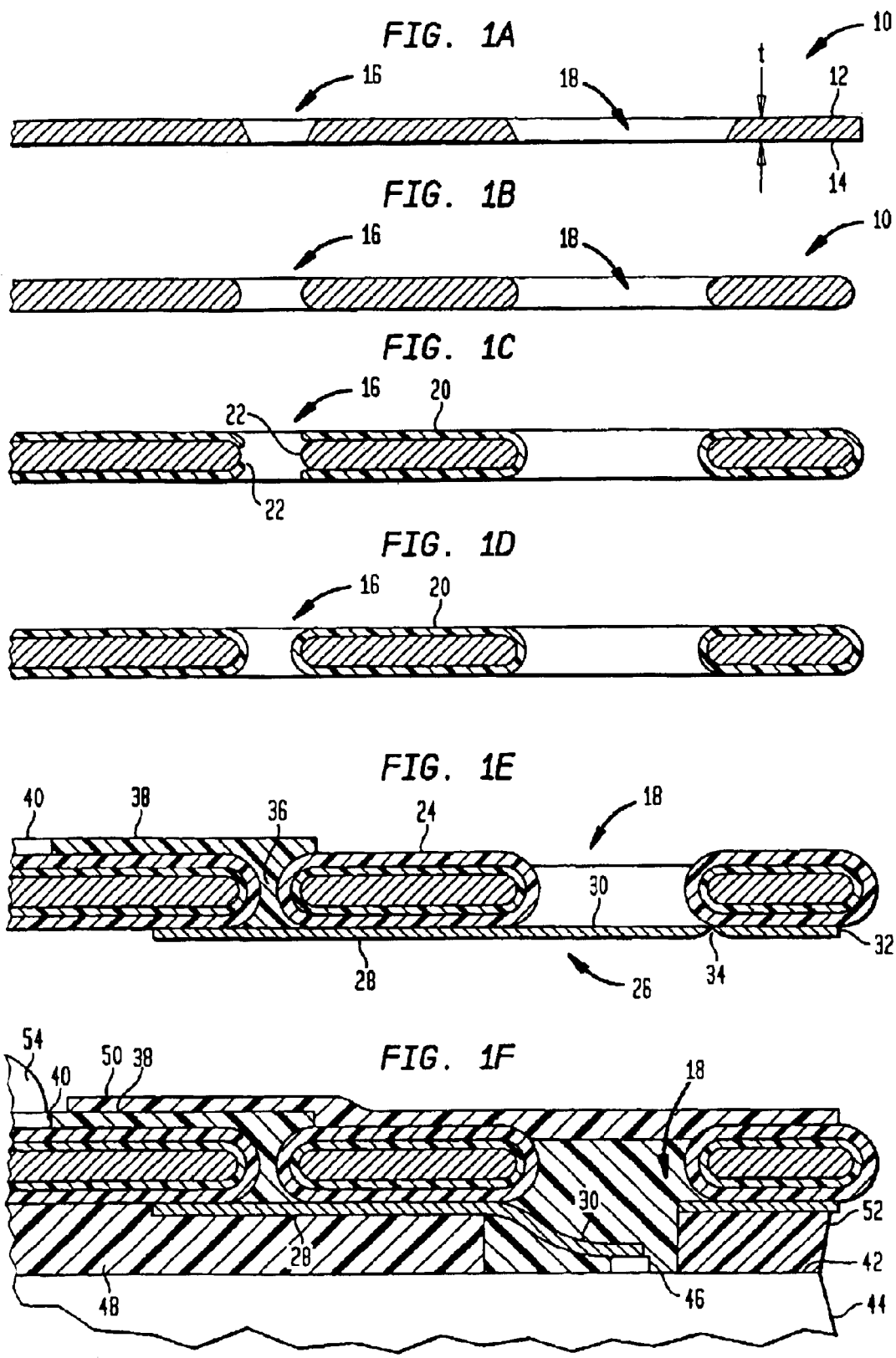
FIGS. 1A–1F are fragmentary, sectional views depicting a component in accordance with one embodiment of the invention during successive stages of processing and connection to other elements of microelectronic assembly.

The process in accordance with one embodiment of the invention begins with an electrically conductive sheet, preferably a metallic sheet 10 having a first major surface 12 a second major surface 14 and a thickness dimension t between these major surfaces. Typically, the thickness of the sheet is less than 100 µm, and more typically between about 25 µm and about 75 µm most commonly between about 10 µm and 50 µm. Sheet 10 may be formed from essentially any metal. However, where the component will be connected to an adjacent element by relatively inflexible or fatigue-sensitive connections such as solder bonds in service, it is desirable to use a metal having a coefficient of thermal expansion close to that of the adjacent element. For example, where the component will be solder-bonded to a circuit panel, it is desirable to use a metal having a coefficient of thermal expansion close to that of the circuit board. Many common circuit panels, such as those based on epoxies and polyimide, and those using other dielectric materials with copper conductive elements, have coefficients of thermal expansion close to that of copper, i.e., about $12 \times 10^{-6}/^\circ$ C. to about $20 \times 10^{-6}/^\circ$ C. Where the component will be connected to such a circuit panel by a rigid or fatigue-sensitive connection, the metal sheet used in fabrication should have a coefficient of thermal expansion within this range. Where such a coefficient of expansion is desired, alloys containing more than 50% copper by weight are preferred, and copper, such as rolled and annealed copper is particularly preferred. Other metals can be used to provide coefficients of thermal expansion matched to other surrounding components.

The sheet is etched to form holes 16 extending between the major surfaces. In the particular embodiment shown, holes 16 have diameters less than about 100 microns. The etching process also forms bond window apertures 18. Apertures 18 are considerably larger than hole 16. For example, each bond window 18 may be an elongated, rectangular slot about several mm wide and several mm long. The etching processes used to form hole 16 and apertures 18 may include conventional selective etching techniques using conventional photographically patterned resists to control the locations where etching occurs. After etching, and after removal of the resists, the sheet typically has sharp edges at the holes and at the bond window apertures.

In the next stage of the process, the sheet is electropolished. In the electropolishing step, the sheet 10 is immersed in a liquid electrolyte along with a cathode, and the sheet is maintained at a positive electrical potential with respect to the cathode so that material is removed from the sheet by electrolytic action and deposited on the cathode. Typically, the electrolyte is an acid. For example, for a copper or copper-based alloy sheet, the electrolyte may include HCl and CuCl. Electrolytic removal smooth sharp edges and projections on the metallic sheet at hole 16 and at bond window aperture 18, as diagrammatically indicated in FIG. 1B. Although the edge of the hole is shown as a rounded, torodial surface in FIG. 1B and in succeeding figures, it should be appreciated that the figures represent an idealized view of the component. After electropolishing, the sheet is removed from the electrolyte and subjected to conventional neutralization and rinsing steps to remove clinging electrolyte.

Following neutralization and rinsing, the sheet is subjected to a first electrophoretic deposition step. In this step, the sheet in immersed in a bath containing a dispersion of partially polymerized or unpolymerized organic material. The organic material typically has charged moieties. An electrical potential is applied between the sheet and a counterelectrode which is also in contact with the dispersion. The electrical potential attracts the organic material from the dispersion and forms a thin coating of uncured material on the surface of the part. Following deposition of the uncured material, the sheet is removed from the dispersion and cured. The curing forms a continuous, dielectric layer 20 on the surfaces of the sheet.

Numerous electrophoretic deposition coatings are known in the art. For example, materials for applying an epoxy coating are sold under the designation Powercron cationic epoxy (400–600 series) by PPG Industries, Inc., Springdale, Pa., U.S.A. One particularly useful material for this stage is that sold under the designation EIV 643 by PPG Industries. The deposition bath used in this step typically includes about S to 36% polymer by weight in deionized water. The applied potential typically increases progressively from about 0 to an upper endpoint of about 400 volts or less during the deposition stage, most typically to an upper end point of about 100–200 volts. During this step, the current density desirably is maintained below about 1 amp/in$^2$ (0.16 amp/cm$^2$) of exposed sheet surface. Typically, the impedance of the deposition system rises rapidly within the first few seconds of the deposition step, as the coating deposits on the metal sheet. During these first few seconds, the current density desirably is maintained below the desired limit by manual or automatic feedback control of the potential source based on monitoring of the current passing through the system. As the impedance rises, the current density falls well below the desired limit, and feedback control of the potential source based on current can be replaced by control of the applied voltage, with the applied voltage being increased progressively to the upper endpoint. The amount of coating applied is directly related to current and deposition tune, and hence is directly related to the amount of charge transferred in the process. Typically, the first electrophoretic deposition step takes about 30 seconds to about 20 minutes, preferably between 1 minute and 5 minutes and most preferably about 1–3 minutes. The deposition time and current desirably are selected so that the finished coating on the top and bottom surfaces of the sheet, after all of the deposition and curing steps discussed below, has a thickness of about 10 to about 40 µm, most preferably about 12.5 to about 25 µm.

Following the first electrophoretic deposition step, the sheet is removed from the deposition dispersion and rinsed with a solvent such as deionized water to remove excess deposition dispersion. After rinsing, the sheet is subjected to a curing process which converts the clinging organic material to a continuous dielectric layer. Depending upon the nature of the deposited organic material, the curing process may include exposure to heat or exposure to radiation such as ultraviolet radiation sufficient to initiate polymerization and/or cross-linking reactions in the deposited organic material. For the aforementioned epoxy and acrylic materials, heat can be used. Thus, the sheet desirably is baked about 150° C.–200° C. for about 10–30 minutes. The curing process may be sufficient to completely cure the coating or to cure the coating only partially, leaving some unreacted active sites within the coating capable of further cross linking, polymerization or other curing reactions. However, the curing process should be sufficient to convert the deposited material into a substantially continuous, solid dielectric film. In principle, the first deposition and curing steps discussed above should be sufficient to form a complete dielectric film completely covering the sheet. In practice, defects in the film tend to occur in and adjacent holes and apertures in the metallic sheet. Defects 22 are diagrammatically depicted in FIG. 1C. The precise mechanism involved in formation of these defects is not known.

After the first deposition step and after curing of the material deposited in the first deposition step, the sheet is again immersed in a deposition bath and subjected to a second electrophoretic deposition step. The deposition bath used in the second deposition step may include the same polymer as that used in the first deposition step or a different polymer. The voltage applied in the second step typically is on the same order as the endpoint voltage in the first deposition step. The deposition bath used in the second deposition step may contain a lower concentration of the uncured polymer but typically is in the range of about 5% to about 36% polymer by weight. The deposition bath used in the second coating step may also contain additives of the type used to improve edge coverage in single-step electrophoretic coating processes for large articles with dimensions many tunes those of microelectronic components. For example, a dispersion using aforementioned Powercron EIV 643 can be also incorporate an additive sold by PPG under the designation CP-932, which contains amorphous silica in addition to the epoxy polymer. The CP-932 material is added so as to provide a ratio of additive solids (principally amorphous silica) to polymer of about 0.05:1 to 0.20:1. Here again, the dispersion includes deionized water as a diluent. The current flowing during the second deposition step typically is less than that which flows during the first deposition step. The second deposition step desirably continues for about 15 seconds–5 minutes, and more particularly between about 30 seconds and 2 minutes. During the second deposition step, material from the deposition bath are deposits at any defects in the coating provided by first deposition and curing steps. After the second deposition step, the sheet is removed from the deposition bath and the newly deposited organic material is cured again, typically by the same steps as are used to cure the first-deposited material.

Following the second deposition and curing steps, the polymeric dielectric coating 20 completely covers those areas of the metallic sheet which were exposed to the deposition baths, including interior surfaces of holes 16 and bond window apertures 18. However, the polymeric coating does not occlude the holes or apertures. In a variance of this procedure, the second deposition and curing steps can be repeated so that the process as a whole includes three or more deposition and curing steps.

An adhesive surface 24 is then provided on the dielectric layer by brushing, spraying, dipping, roll coating or other suitable application techniques. The adhesive desirably wets the polymer layer. Suitable adhesives for epoxy polymer layers include thermoplastic epoxies as, for example, those sold under the designation Thermoplastic Epoxy Adhesive 482 by the Alpha Metals, Inc. of Jersey City, N.J., U.S.A. Alternatively, the polymer layer itself may provide the adhesive surface. For example, the curing stages may be conducted so that a reactive polymer layer such as an epoxy or acrylic is only partially reacted, leaving some reactive sites. In yet another alternative, the polymer layer may be immersed in a suitable solvent which softens the polymer so to give the polymer a substantial degree of surface tack.

A metallic layer is then applied on a surface of the sheet and etched to form metallic leads 26. In the embodiment illustrated in FIG. 1E, the metallic layer is applied to the sheet bottom surface 14. The metallic layer is etched to form leads including anchor sections or traces extending 28 along the surface on the first side of the bond window aperture 18, connection sections 30 extending across the bond window aperture and securement sections 32 located on the second side of the bond window aperture. The leads also include frangible sections 34 at the juncture of each connection section and the associated securement section. The configuration of these leads may be as disclosed, for example, in commonly assigned U.S. Pat. Nos. 5,489,749; 5,491,302; 5,629,239; and 5,597,470, the disclosures of which are incorporated by reference herein. Conventional selective etching techniques may be utilized, as well as the specific techniques disclosed in the aforementioned patents. As disclosed in these patents, the process of fabricating the leads from the sheet may include selective plating as well as etching. Plating processes are facilitated by the presence of the continuous sheet covering the entire surface which can convey a plating current to any point on the surface; there is no need for special conductive members or bus bars to provide conductivity.

Either before or after application of the metal sheet, and either before or after treatment of the sheet to form the traces and connection sections, metallic through conductors or via liners 36 are deposited within holes 16. These metallic via liners are in contact with traces 28, and extend from the traces to the top surface of the sheet. The via liners serve also as anchors to further secure the traces 28 to the sheet. The via liners may be formed by generally conventional processes such as sputtering or electroless plating followed by electroplating. The same processes which form via liners 36 also form additional traces 38 on the top surface of the sheet, terminating at terminals or pads 40 on the top surface.

The connection component can be utilized in the same manner as the connection components discussed in the aforementioned patents to form semiconductor chip assemblies. As depicted in FIG. 1F, the connection component may be assembled to a semiconductor chip 44 so that the bottom surface of the connection component faces the front surface 42 of the semiconductor chip 44, and so that contacts 46 on the semiconductor chip front surface are aligned with bond window apertures 18. A compliant layer 48 such as a layer of a gel or elastomer desirably is provided between the bottom surface of the connection component and the surface chip. As also described in the aforementioned patents, the connection sections 30 of the leads can be bonded to the contacts 46 on the chip by advancing a bonding tool into the bond window aperture and bending the connection sections downwardly, thereby breaking the frangible sections. After bonding, a protective dielectric cover layer 50 may be applied over the top surface of the connection component. An encapsulant 52 may be introduced between the connection component and the chip.

As described, for example, in commonly assigned U.S. Pat. No. 5,659,952, the disclosure of which is hereby incorporated by reference herein, the compliant layer may include a porous element such as a plurality of individual compliant pads, and the encapsulant may enter into the porous layer so as to form part of the compliant layer in the finished device. The finished assembly provides the packaged semiconductor chip. Masses of electrically conductive bonding materials such as solder masses 54 may be provided on terminals 40, and these terminals may be bonded to a larger substrate such as a circuit panel (not shown) to connect the contacts 46 of the chip to the circuit panel.

In use, the connection component or chip carrier provides significant benefits. The coefficient of thermal expansion of the chip carrier as a whole is controlled by the coefficient of expansion of the metallic element, which is close to the coefficient of thermal expansion of the metallic elements on the chip carrier, such as traces 28 and 38. Therefore, thermal expansion will not stress the bond between the traces and the polymeric layer. Moreover, the thermal expansion of the chip carrier is predictable and uniform. This facilitates registration of the features on the chip carrier with features of the chip and with features of the circuit panel.

Figure 2:
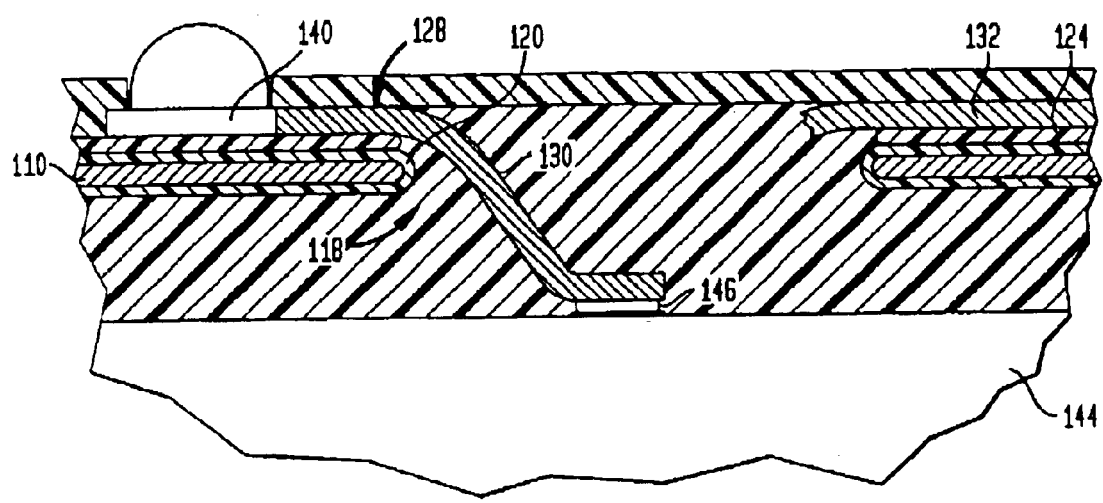
FIG. 2 is a fragmentary, sectional view depicting a component in accordance with another embodiment of the invention in conjunction with other elements of the semiconductor assembly.
Figure 3:
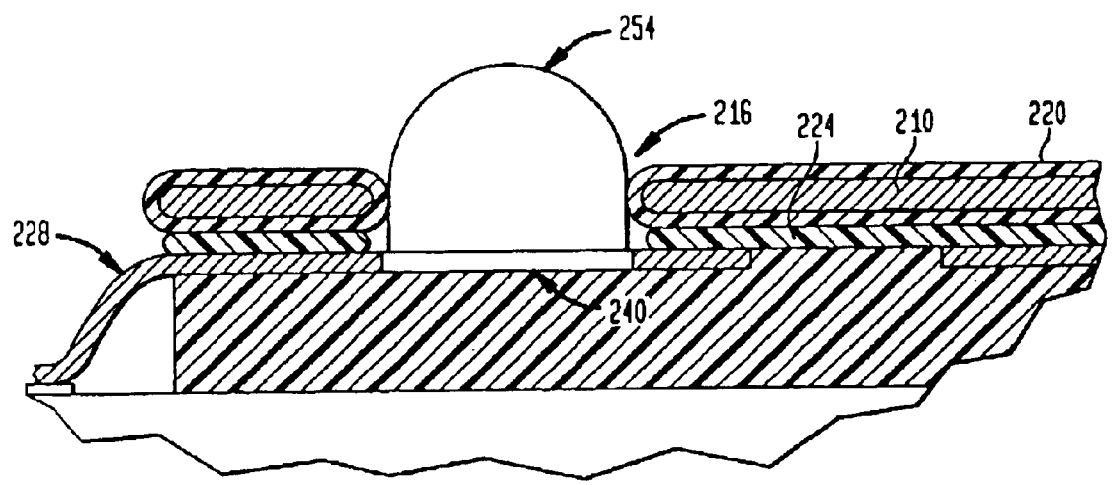
FIG. 3 is a fragmentary, sectional view depicting a component in accordance with yet another embodiment of the invention.

A component according to a further embodiment of the invention, depicted in FIG. 2, includes a metallic conductive sheet 110 with bond windows 118 similar to the sheet and bond windows discussed above. The component also includes an electrophoretically deposited dielectric coating 120 similar to the coatings discussed above. In the component of FIG. 2, however, the adhesive 124 is provided only on the first or top side of the component. Metallic traces 128 and pads 140 are provided on the top surface of the component. Here again, each trace extends to a connection section 130 which extends across the bond window 118 and is temporarily anchored by a securement section 132 on the opposite side of the bond window. After the component is assembled to semiconductor chip 144, the leads are bent downwardly through the bond window to engage contacts 146 on the trip, breaking the leads away from the securement sections 132. The dielectric layer 120 covering the metallic sheet on the interior of the bond window 118 insulates the connection sections of the leads from the metallic sheet 110.

A connection component according to a further embodiment of the invention has a metallic sheet 210 with holes 216 extending through the sheet. These holes are relatively large, desirably about 500 μm or more in diameter. Once again, the sheet is provided with an electrophoretically deposited dielectric coating 220 which covers the surfaces of the sheet, including the interior surfaces of the sheet within hole 216. An adhesive layer 224 is provided on the bottom surface of the sheet. Metallic traces 228 extend to conductive pads 240 aligned with holes 216. In use, a mass of conductive bonding material such as solder may be deposited in each hole 216 to form a bond with the aligned bonding terminal 240. It should be appreciated that the thicknesses of sheet 210 and the associated layers are greatly exaggerated in the drawings for clarity of illustration. In practice, the thickness of sheet 210 with electric layers 220 thereon amounts to less than 200 μm and the ratio of the diameter of each hole to this thickness is about 1:1 or more, and more typically about 5:1 or more. Therefore, solder masses can be provided on pads 240 readily as, for example, by depositing solder holes within bills 216. Solder masses 254 serve to bond pads 240 to the mating pads of a mounting substrate such as a circuit panel. The electrophoretically deposited polymer layer insulates the solder masses from the metallic sheet.

Figure 4A:
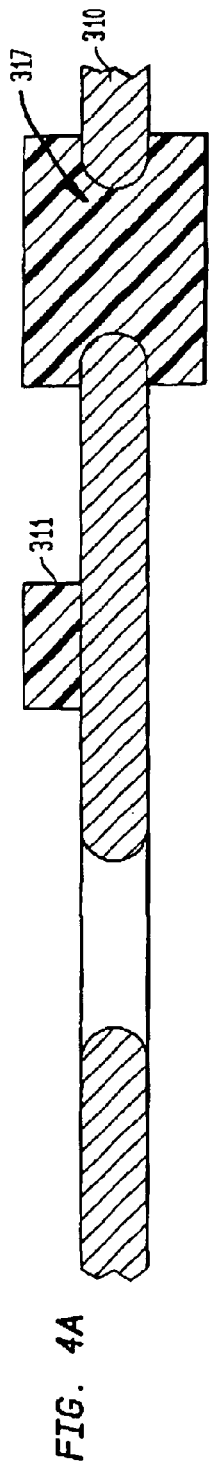
FIGS. 4A–4D are fragmentary sectional views depicting a component in accordance with a further embodiment of the invention during successive states of processing.
Figure 4B:
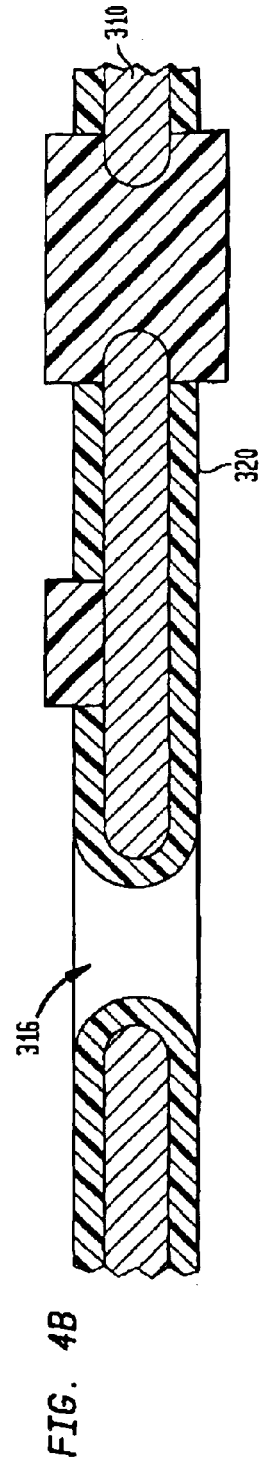
Figure 4C:
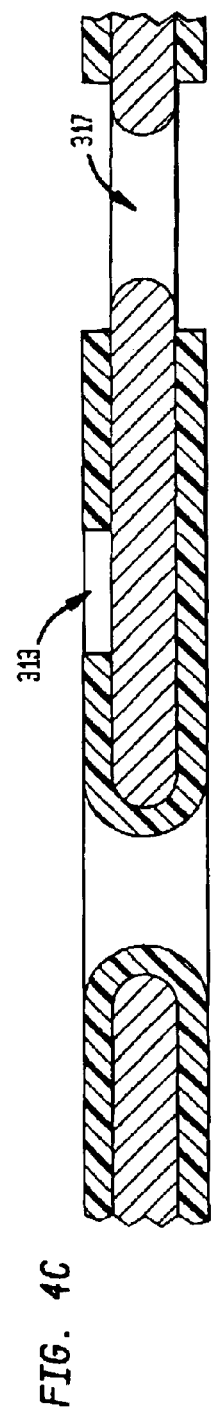
Figure 4D:
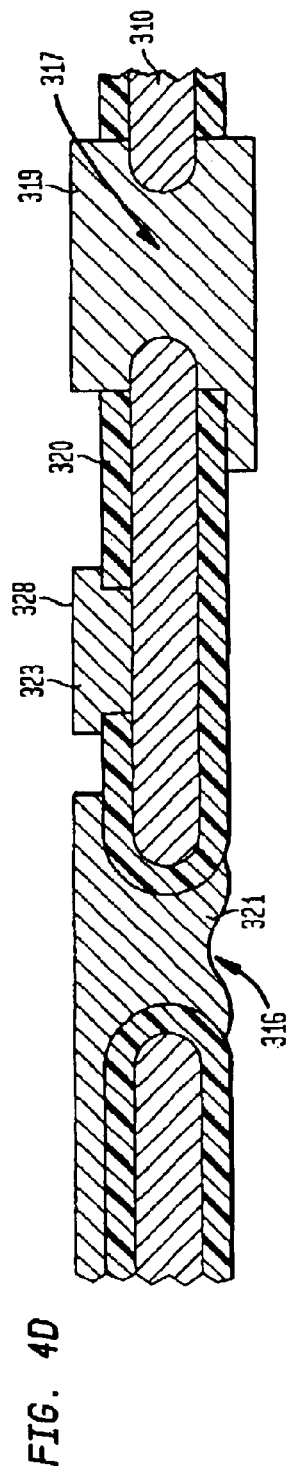

The electrophoretic deposition process can be controlled by selective masking of the conductive element or sheet 310 (FIG. 4A). A resist may be provided on regions of the element where coating with the dielectric polymer is not desired, such as dots 311 of resist on the top surface. Resist may also be provided within holes or apertures 317 to suppress dielectric coating of the interior surfaces of such holes. The resist desirably is a material which can be applied selectively as, for example, a photo-imagable resist which can be applied nonselectively and then selectively treated with illumination so as to cure the resist only in selected areas. The uncured resist is then removed, leaving the resist in the desired pattern. Other photo-imagable resists are treated in a reverse process where radiation is applied only to cures which are to be left uncured. Still other resists may be applied selectively by processes such as stenciling, silk-screen printing, gravure printing or other selective application processes. In a variant of this technique, the resist is applied and cured nonselectively and then selectively removed as, for example, by laser oblation of the resist in areas where the resist is not desired.

The dielectric coating 320 is then applied electrophoretically in the same manner as discussed above. The dielectric coating coats the various surfaces of the sheet or element 310, including the interior surfaces of hole 316 where the resist is not provided. However, the resist prevents deposition of the coating in areas covered by the resist. After the coating process is complete, the resist is removed. Desirably, the cured resist has chemical and physical properties which allow it to remain intact during the deposition and curing stages used to turn the electrophoretic coating, but of which also allow it to be removed by a chemical process which does not attack the deposited polymeric coating. For example, for use with the aforementioned epoxy coatings, the resist may include an electrodeposited ("ED") resist such as that sold under the designation EAGLE 2100 ED photo-resist by the Shipley Company of Marlborough, Mass., U.S.A. Removal of the resist leaves the coating with open apertures 313 at the areas formerly occupied by dots 311 and also leaves uncoated holes 317. Using the techniques discussed above, metallic liners and traces may be applied. For example, the liner 319 within an uncoated hole 317 contacts the metallic sheet 310, whereas the liner 321 within a coated hole 316 does not contact the metallic sheet. Also, metallic liners 323 deposited into aperture 313 can connect the metallic sheet 310 with surface traces 328 extending over the polymeric coating. These features can be used to form power or ground connections.

Figure 5A:
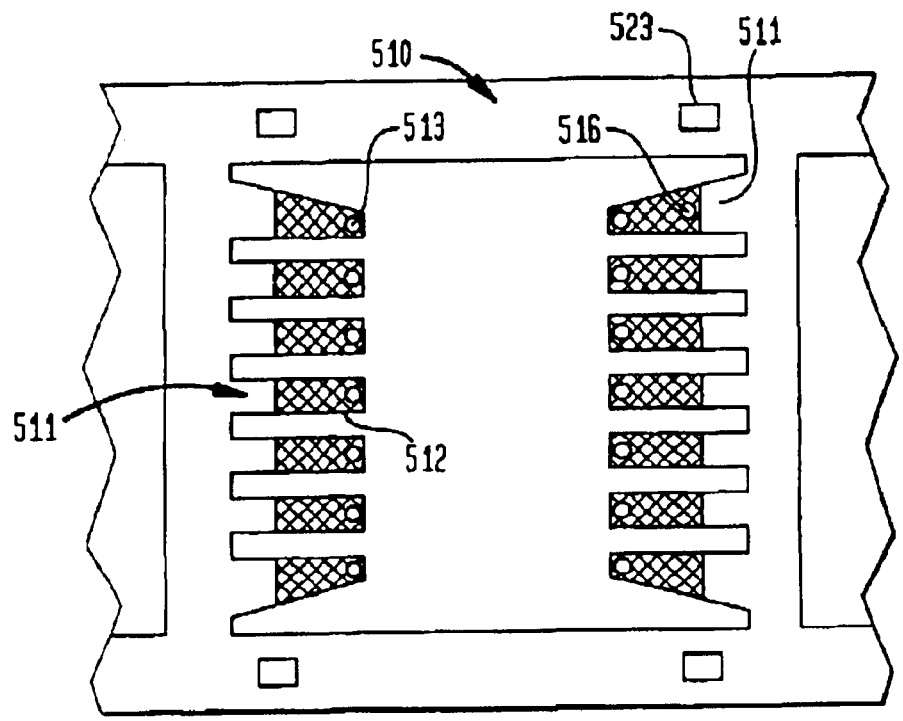
FIGS. 5A–5C are diagrammatic plan views depicting a component in accordance with a further embodiment of the invention during successive states of manufacturing.

In the embodiments discussed above, the conductive element incorporates a substantially continuous, flat metallic sheet. However, the present invention can be applied to conductive articles other than solid, continuous sheets. For example, as shown in FIG. 5A, a metallic lead frame 510 with a plurality of inwardly-projecting metallic tabs 511 may be masked using a resist as discussed above so as to selectively deposit the polymeric coating only on the areas 512 of the tabs indicated by cross-hatching in FIG. 5A. These areas may be provided with dots similar to the resist dots 311 discussed above with reference to FIG. 4. These dots lead to the formation of uncoated apertures 513 within coated regions 512. Also, some or all of the tabs may be provided with holes 516 extending through them. The dielectric coating may be applied on the interior surfaces of these holes, or else the holes may be left uncoated, by applying or omitting resist within the holes as discussed above. After deposition of suitable metallic liners (not shown) within holes 513, a further metallic element such as a sheet 518 may be assembled to the tabs and electrically connected to the tabs by the liners within holes 513. Sheet 518 may then be etched to form smaller elements, such as thin bonding regions 521 at the tips of projections 511 (FIG. 5C). The particular configuration illustrated in FIG. 5 is merely exemplary of the numerous configurations of solid articles which can be used as conductive elements in the electrophoretic deposition process.

Figure 5B:
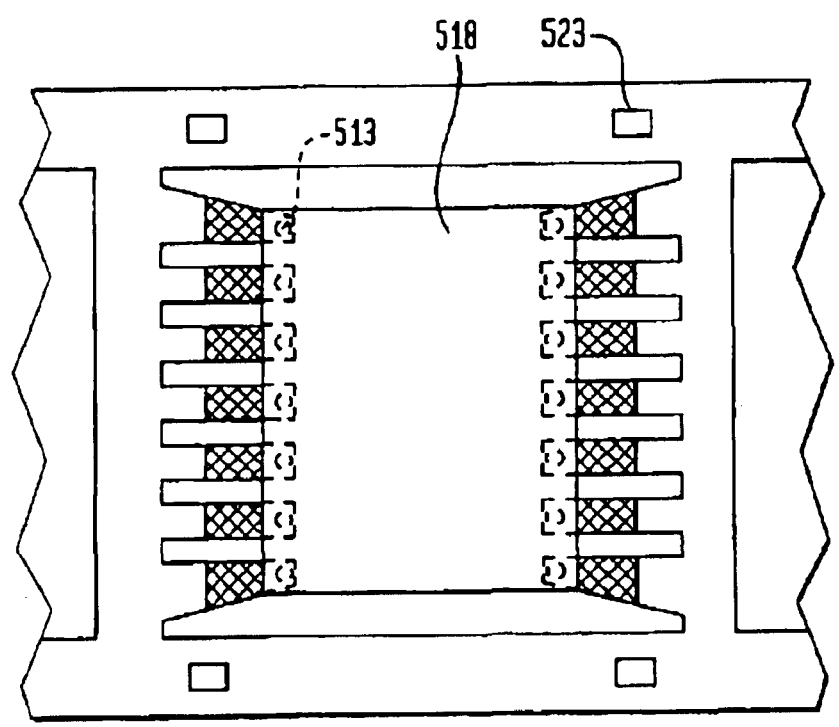
Figure 5C:
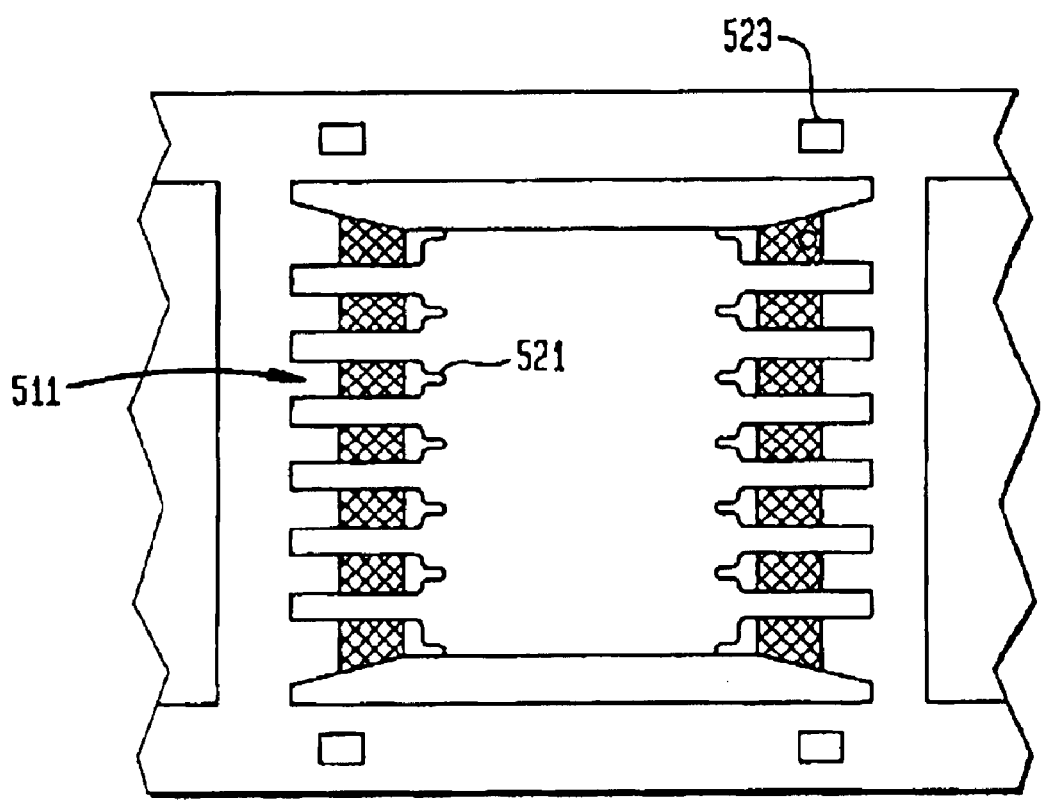

As depicted in FIG. 5, the lead frames 510 are formed as part of a continuous tape incorporating numerous lead frames. The tape is provided with sprocket holes 523 (FIGS. 5A–5C) or other features which allow feeding and registration of the tape during processing. Such a continuous tape may be advanced through the various stages of the process, so that a leading portion of the tape is being treated in one stage of the process while a trailing portion of the tape is being treated in an earlier stage of the process. The sheets depicted in FIGS. 1–5 may also be provided in the form of a continuous or semi-continuous tape and processed in this manner.

The components discussed above can be utilized as chip carriers in a variety of configurations. For example, the assembly depicted in FIG. 6 has a chip carrier 600 with a metal core 602 and a dielectric layer 604 on the core formed in accordance with the methods discussed above. A semiconductor chip 610 having contacts 612 on a front surface is assembled with the chip carrier so that the chip carrier overlies the front surface, and so that a compliant layer 614 is disposed between the chip front surface and the chip carrier. Chip carrier 600 has terminals 616 on the top surface of the carrier, i.e., the surface facing away from the chip, which are connected via flexible leads 618 extending through an aperture or bond window 620 in the chip carrier to contacts 612 on the chip, in the manner discussed above with reference to FIG. 2. Terminal 616a is disposed on a central region of chip carrier 600 overlying a central region of the chip, whereas terminal 616b is disposed on a peripheral region of the chip carrier projecting outwardly beyond the periphery of the chip, and outboard of chip contacts 612. Thus, the leads from chip contacts 612 to terminals 616b "fan-out" or extend outwardly, away from the center of the chip, whereas other leads from other contacts 612 "fan-in" or extend inwardly towards terminals 616a. A support element such as a protective cover or ring 622 may support the outboard regions of the chip carrier, and the compliant layer 614 may extend between the support element and chip carrier. Other terminals 616c are disposed on the bottom or chip-facing side of the chip carrier. These terminals are aligned with holes 626 in the chip carrier as discussed above with reference to FIG. 3, so that the terminals are exposed at the top surface. The leads associated with terminals 616a–616c can be connected to the chip using a bonding tool advanced into the bond windows 620. Still other terminals 616d are connected to vias 623 extending through the chip carrier, which in turn are connected to leads 624 extending between the bottom or chip-facing side of the chip carrier and the chip contacts 612. Such leads may be formed without the use of bond windows using processes such as those described in commonly assigned U.S. Pat. No. 5,518,964. As described therein, the lead may initially extend along the surface of the chip carrier or the surface of the chip. After the lead is connected, the chip carrier is moved away from the chip, thereby deforming the lead. Still other terminals are connected to masses 625 of low-melting material enveloped by the compliant layer, as described in commonly assigned International Patent Publication WO 97/40958, the disclosure of which is hereby incorporated by reference herein. The low-melting material at least partially liquefies at the operating temperature of the chip, and thus permits movement of the chip carrier 600 with respect to the chip. As also disclosed in the commonly assigned patents and publications, the process of assembling and connecting a chip carrier may be performed on a wafer level, i.e., before the chip is severed from the wafer, or else may be performed using individual chips. A wafer level process may utilize individual chip carriers or may use a larger sheet including plural chip carriers, which is severed when the chips are severed from the wafer. In this regard, the dimensional stability of the metal core chip carrier greatly facilitates the assembly process, as it facilitates registration of features on the chip carrier with features of the chip or wafer. The assembly of FIG. 6 includes a variety of connection techniques. More typically, only one or a few techniques are employed in a single assembly.

Figure 6:
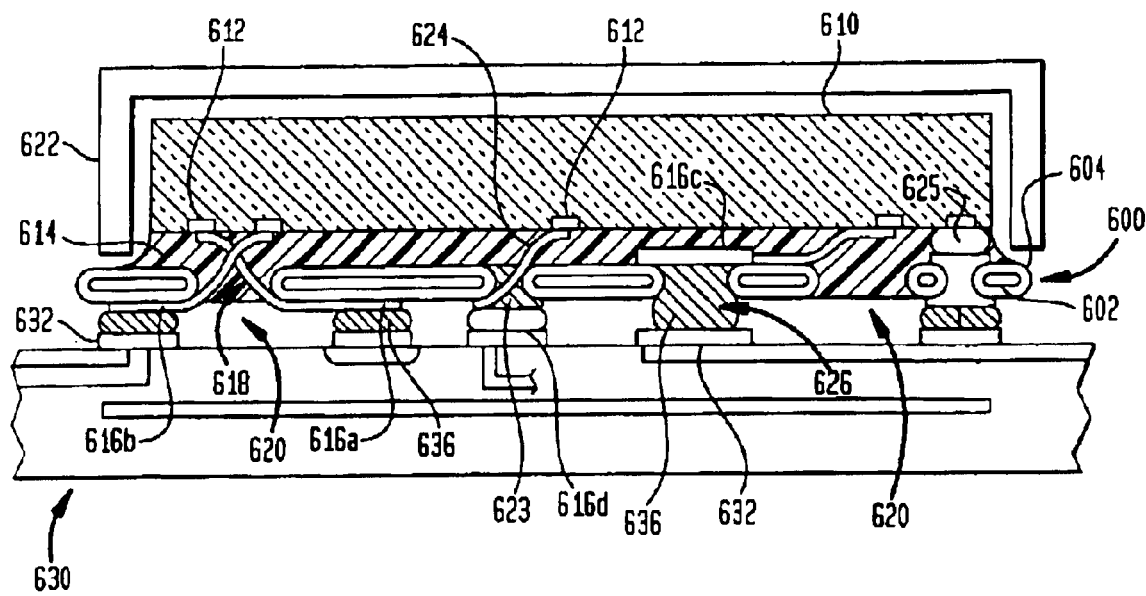
FIG. 6 is a diagrammatic sectional view depicting an assembly in accordance with a further embodiment of the invention.

The assembly of FIG. 6 further includes a substrate or circuit panel 630 having contact pads 632 on a top or chip-facing surface. Substrate 630 may be a flex circuit or rigid circuit panel such as a common FR-4 circuit board. Contact pads 632 are connected to contacts 616 on the chip carrier by relatively rigid solder bonds 636. The coefficient of thermal expansion of substrate 630 is substantially the same as that of the chip carrier. For a copper-core chip carrier, the coefficient of thermal expansion of the substrate desirably is between about $12 \times 10^{-6}/°$ C. and about $20 \times 10^{-6}/°$ C. Because the coefficients of thermal expansion of the chip carrier and substrate are well matched, there is minimal stress imposed on the solder bonds 636 upon heating or cooling of the assembly during manufacture and operation. Heating and cooling may cause substantial movement of the chip carrier relative to the chip. However, because the chip carrier is readily movable relative to the chip, such movement does not impose significant stress on the connections. For example, flexible leads 618, 624 can bend to accommodate such movement, whereas low-melting material 625 is in a liquid state and hence can accommodate movement without appreciable stress. The compliant layer 614 mechanically decouples the chip carrier 600 from the chip, and allows the chip carrier to move freely.

In a further embodiment (not shown) the chip carrier is expansion-matched to the chip, rather than to the circuit board. For example, where the chip is a conventional silicon chip, the chip carrier may have a metallic core formed from molybdenum, Invar or other alloys having a coefficient of thermal expansion close to that of silicon, i.e., about $2.5–4.0 \times 10^{-6}/°$ C. Unless otherwise specified, the term "coefficient of thermal expansion" as used herein refers to the means coefficient of linear thermal expansion (as opposed to area or volumetric expansion). Also, unless otherwise specified the value of such coefficient is the value at about 20–30° C. In this reverse embodiment, the connections between the chip and the substrate are made using the movable connections, such as flexible leads, low-melting materials or the like, whereas the connections between the chip carrier and the chip may be relatively rigid or movable. In this reverse embodiment, or in the embodiment of FIG. 6, a compliant layer may be provided between the chip carrier and the substrate.

Figure 7:
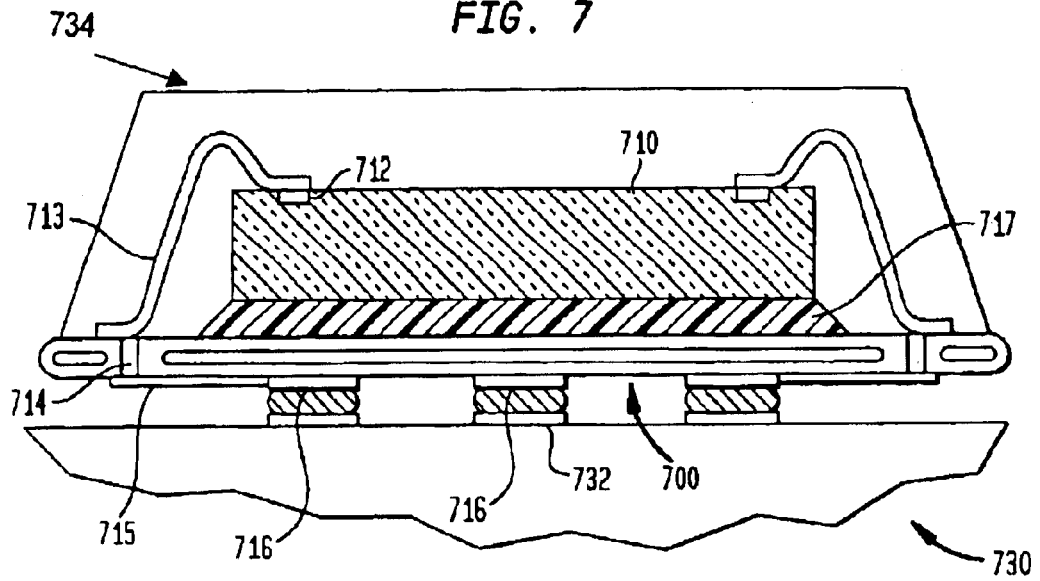
FIG. 7 is a view similar to FIG. 6 but depicting an assembly in accordance with yet another embodiment of the invention.

As shown in FIG. 7, an assembly according to a further embodiment includes a chip 710 and a metal-core chip carrier 700 overlying the rear face of the chip. Contacts 712 on the front face of the chip are connected by wire bonds 713 to the conductive features of the chip carrier, such as to vias 714 extending to lead portions 715 on the chip carrier, which in turn extend to the terminals 716. Here again, the terminals (and the associated lead portions 715) can be positioned on the surface of the chip carrier facing away from the chip as shown, or on the surface facing toward the chip carrier. A compliant layer 717 is disposed between the chip and the chip carrier. Here again, the chip carrier desirably is expansion-matched to the substrate, and the terminals on the chip carrier are bonded to the contact pads 732 of the substrate 730. An encapsulant 734 covers the chip and wire bonds. The encapsulant may be a relatively soft material such as an elastomer, or else may be a so-called "rigid"

polymer such as a relatively hard epoxy. Even where as so-called rigid polymer is employed, however, the assembly still retains substantial immovability of the chip carrier and terminals 716 relative to the chip itself.

As these and other variations and combinations of the features discussed above can be utilized without departing from the present invention as defined by the claims, the foregoing description of the preferred embodiments should be taken by way of illustration rather than by way of limitation of the invention as defined by the claims.

What is claimed is:

1. A microelectronic assembly comprising:
   (a) a packaged semiconductor chip including:
      (i) a semiconductor chip having a front surface with contacts thereon and a rear surface;
      (ii) a connection component disposed adjacent the chip, said connection component having terminals thereon, at least some of said terminals being connected to at least some of said contacts on the chip, wherein said connection component overlies a surface of the chip, said connection component including a conductive sheet core and a polymeric dielectric coating overlying and adhering to said conductive core, at least some of said terminals being disposed on said coating so that said coating maintains such terminals separate from said core; and
   (b) a circuit panel larger than said connection component, said packaged chip being mounted on and said circuit panel with said circuit panel extending beyond said connection component, said circuit panel having contact pads thereon, said contact pads of said circuit panel being connected to said terminals of said connection component, said connection component and said substrate having substantially equal coefficients of thermal expansion.

2. An assembly as claimed in claim 1 wherein said connection component is movable with respect to the chip.

3. An assembly as claimed in claim 2 further comprising flexible leads, said terminals being connected to said contacts through said flexible leads.

4. An assembly as claimed in claim 2 wherein said connection component and said circuit panel have coefficients of thermal expansion between about $12\times10^{-6}/°$ C. and about $20\times10^{-6}/°$ C.

5. An assembly as claimed in claim 4 wherein said circuit panel is a dielectric panel with copper traces thereon.

6. An assembly as claimed in claim 4 wherein said circuit panel is a fiber reinforced epoxy panel with copper traces thereon.

7. An assembly as claimed in claim 2 further comprising solder masses, said terminals being bonded to said contact pads on said circuit panel by said solder masses.

8. An assembly as claimed in claim 1 further comprising a compliant layer disposed between the connection component and the chip.

9. An assembly as claimed in claim 1 wherein said connection component overlies the rear surface of said chip.

10. A packaged semiconductor chip comprising:
    (a) a semiconductor chip having a front surface with contacts thereon and a rear surface;
    (b) a connection component disposed adjacent the chip, said connection component having terminals thereon, at least some of said terminals being connected to at least some of said contacts on the chip, wherein said connection component overlies a surface of the chip, said connection component including a conductive sheet core and a polymeric dielectric coating overlying and adhering to said conductive core, at least some of said terminals being disposed on said coating so that said coating maintains such terminals separate from said core,
    wherein said connection component overlies the front surface of said chip, said connection component having one or more bond windows therein, said conductive core having apertures at each such bond window, said coating extending into said apertures of said core and covering the metallic core within said bond windows, said at least some of said terminals being connected to said contacts through said bond windows.

11. A connection component comprising a structure including a sheetlike metallic core, a polymeric dielectric coating overlying and adhering to said metallic core, terminals disposed on said coating so that said coating maintains such terminals separate from said core, and leads connected to said terminals extending from said structure for bonding to contacts of a semiconductor chip,
    wherein said structure has one or more bond windows therein, said metallic core having apertures at each such bond window, said coating extending into said apertures of said core and covering the metallic core within said bond windows, said leads being flexible and extending at least partially across said one or more bond windows, said leads being adapted for bonding to a contact of a semiconductor chip within said one or more bond windows.

12. A component as claimed in claim 11 wherein said metal core has a coefficient of thermal expansion between about $12\times10^{-6}/°$ C. and about $20\times10^{-6}/°$ C.

13. A connection component comprising a structure including a sheetlike metallic core, a polymeric dielectric coating overlying and adhering to said metallic core, terminals disposed on said coating so that said coating maintains such terminals separate from said core, and leads connected to said terminals extending from said structure for bonding to contacts of a semiconductor chip,
    wherein said structure has one or more bond windows therein, said metallic core having apertures at each such bond window, said coating extending into said apertures of said core and covering the metallic core within said bond windows, said leads being flexible and extending at least partially across said one or more bond windows,
    wherein one or more of said flexible leads are electrically connected to said core and others of said flexible leads are not connected to said core and are electrically isolated from said core.

* * * * *